(12) United States Patent
Wu et al.

(10) Patent No.: US 10,566,203 B1
(45) Date of Patent: Feb. 18, 2020

(54) METHOD FOR ALLEVIATING ETCHING DEFECT OF SALICIDE BARRIER LAYER

(71) Applicant: WUHAN XINXIN SEMICONDUCTOR MANUFACTURING CO., LTD., Hubei (CN)

(72) Inventors: Chenglong Wu, Hubei (CN); Qingwei Luo, Hubei (CN); Yun Li, Hubei (CN); Jun Zhou, Hubei (CN)

(73) Assignee: Wuhan XinXin Semiconductor Manufacturing Co., Ltd., Hubei (CN)

( * ) Notice: Subject to any disclaimer, the term of this patent is extended or adjusted under 35 U.S.C. 154(b) by 0 days.

(21) Appl. No.: 16/236,979

(22) Filed: Dec. 31, 2018

(30) Foreign Application Priority Data

Nov. 5, 2018 (CN) .......................... 2018 1 1309450

(51) Int. Cl.
*H01L 21/285* (2006.01)
*H01L 21/308* (2006.01)
*H01L 23/532* (2006.01)
*H01L 23/485* (2006.01)
*H01L 21/28* (2006.01)
*H01L 21/3213* (2006.01)

(52) U.S. Cl.
CPC .. *H01L 21/28518* (2013.01); *H01L 21/28052* (2013.01); *H01L 21/3081* (2013.01); *H01L 21/3085* (2013.01); *H01L 21/32134* (2013.01); *H01L 23/485* (2013.01); *H01L 23/53209* (2013.01)

(58) Field of Classification Search
None
See application file for complete search history.

(56) References Cited

U.S. PATENT DOCUMENTS

| | | | | |
|---|---|---|---|---|
| 2009/0072325 A1* | 3/2009 | Wu | ................. | H01L 21/28518 257/408 |
| 2014/0264876 A1* | 9/2014 | Ryan | ................. | H01L 23/53209 257/751 |
| 2015/0206963 A1* | 7/2015 | Ho | ................. | H01L 21/31111 257/411 |
| 2018/0315652 A1* | 11/2018 | Tsai | ................. | H01L 21/76831 |
| 2019/0214229 A1* | 7/2019 | Cui | ................. | H01J 37/32091 |

* cited by examiner

*Primary Examiner* — Asok K Sarkar
(74) *Attorney, Agent, or Firm* — Muncy, Geissler, Olds & Lowe, P.C.

(57) ABSTRACT

A method for alleviating an etching defect of a salicide barrier layer is disclosed. The salicide barrier layer includes a first barrier layer, a second barrier layer and a third barrier layer. When the salicide barrier layer is being etched, the third barrier layer is removed during first etching. In this case, the second barrier layer is used as an etch stop layer, and the second barrier layer is removed during second etching. In this case, the first barrier layer is used as an etch stop layer, the first barrier layer is removed during third etching. The salicide barrier layer is divided into three layers, the second barrier layer and the first barrier layer are respectively used as an etch stop layer, so that the third barrier layer and the second barrier layer can be prevented from being over-etched, thereby effectively avoiding defects caused by over-etching and alleviating device performance.

11 Claims, 4 Drawing Sheets

METHOD FOR ALLEVIATING ETCHING DEFECT OF SALICIDE BARRIER LAYER

CROSS-REFERENCE TO RELATED APPLICATION

This application claims the priority of Chinese patent application number 201811309450.3, filed on Nov. 5, 2018, the entire contents of which are incorporated herein by reference.

TECHNICAL FIELD

The present invention relates to the field of semiconductor manufacturing technologies, and specifically, to a method for alleviating an etching defect of a salicide barrier layer.

BACKGROUND

A salicide barrier layer (SAB) is used to protect a surface of a silicon wafer, and under its protection, the silicon wafer does not form an undesired metal salicide with other metals such as Ti and Co.

In most processes, an oxide layer is generally used as a salicide barrier layer. In a manufacturing process, an oxide layer (hereinafter referred to as a "salicide barrier oxide layer") used as a salicide barrier layer needs to be etched to form a patterned salicide barrier oxide layer. In this way, no metal salicide is formed on the surface of the silicon wafer below the patterned salicide barrier oxide layer after etching is performed, but a metal salicide will be formed on the surface of the silicon wafer where the salicide barrier oxide layer has been removed.

At first, salicide barrier oxide layers are generally etched by using a simple dry etching process. However, such a method is usually suitable for etching a salicide barrier oxide layer having only a thickness approximately equal to or greater than 1500 Å.

With the development of the processes, the following solution has been developed: a salicide barrier oxide layer is first partially etched by dry etching and the salicide barrier oxide layer is subsequently etched by wet etching. However, due to isotropy in a wet etching process, an arc-shaped topography structure is finally formed. The topography is disadvantageous for deposition of subsequent conductive substances, and a defect such as a void is easily formed, causing an electrical leakage or a breakdown to easily occur in a finally formed device structure, and affecting performance of the device.

SUMMARY OF THE INVENTION

Based on the foregoing problem, an objective of the present invention is to provide a method for alleviating an etching defect of a salicide barrier layer, to reduce etching defects and improve device performance.

To achieve the foregoing objective, the present invention provides a method for alleviating an etching defect of a salicide barrier layer, including the following steps:

providing a substrate and forming a trench in the substrate;

forming a salicide barrier layer, the salicide barrier layer covering a side wall and a bottom of the trench and an upper surface of the substrate, the salicide barrier layer including a first barrier layer, a second barrier layer and a third barrier layer sequentially formed on the substrate;

performing a first etching process to remove the third barrier layer in the trench until the second barrier layer is exposed;

performing a second etching process to remove the second barrier layer in the trench until the first barrier layer is exposed; and performing a third etching process to remove the first barrier layer in the trench until the trench is exposed, thereby a patterned salicide barrier layer that exposes the trench is formed.

Optionally, the first barrier layer and the third barrier layer are formed of a same material.

Optionally, the first barrier layer and the third barrier layer are both oxide layers, and the second barrier layer is a nitride layer.

Optionally, the first barrier layer and the third barrier layer are both silicon oxide layers, and the second barrier layer is a silicon nitride layer.

Optionally, a thickness of the first barrier layer is smaller than a thickness of the second barrier layer, and the thickness of the second barrier layer is smaller than a thickness of the third barrier layer.

Optionally, the thickness of the first barrier layer ranges from 70 Å to 100 Å, the thickness of the second barrier layer ranges from 200 Å to 300 Å, and the thickness of the third barrier layer ranges from 300 Å to 500 Å.

Optionally, the first etching process, the second etching process and the third etching process are all wet etching.

Optionally, etchants used in the first etching and the third etching are hydrofluoric acids, and an etchant used in the second etching is a phosphate.

Optionally, the method for forming a trench in the substrate includes:

sequentially forming a laminated structure of a dielectric layer and a polysilicon layer on the substrate;

forming a patterned photoresist layer on the polysilicon layer at the top;

using the patterned photoresist layer as a mask, etching the laminated structure to form the trench; and removing the patterned photoresist layer.

Optionally, after forming a trench and before forming a salicide barrier layer, the method further includes:

forming an oxide layer on the side wall and the bottom of the trench; and forming a metal barrier layer on the side wall and the bottom of the trench.

Optionally, after forming a metal barrier layer and before forming a salicide barrier layer, the method further includes: etching the metal barrier layer to expose the oxide layer located at a center of the bottom of the trench.

Compared with the prior art, in the method for alleviating an etching defect of a salicide barrier layer provided in the present invention, the salicide barrier layer includes the first barrier layer, the second barrier layer and the third barrier layer. When the salicide barrier layer is being etched, the third barrier layer is removed during first etching. In this case, the second barrier layer is used as an etch stop layer, and the second barrier layer is removed during second etching. In this case, the first barrier layer is used as an etch stop layer, and the first barrier layer is removed during third etching. The salicide barrier layer is divided into three layers, and the second barrier layer and the first barrier layer are respectively used as an etch stop layer during the first etching and an etch stop layer during the second etching, so that the third barrier layer and the second barrier layer can be prevented from being over-etched, thereby effectively avoiding defects caused by over-etching and alleviating device performance.

Further, the thickness of the first barrier layer is smaller than the thickness of the third barrier layer, and the thickness of the first barrier layer is also smaller than the thickness of the second barrier layer. Therefore, the first barrier layer is easily removed, so that etching defects can be further avoided and device performance can be improved.

DETAILED DESCRIPTION OF EXEMPLARY EMBODIMENTS

Figure 1:
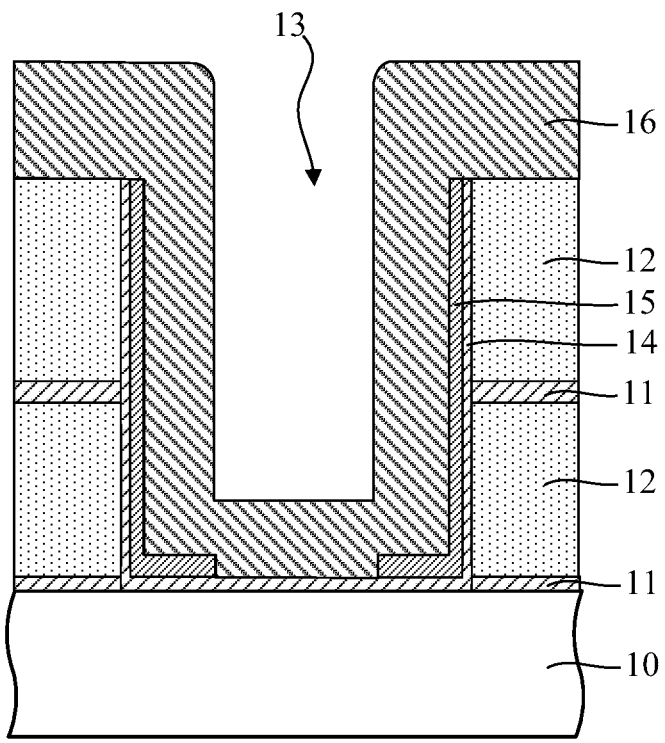
FIG. 1 to FIG. 3 are schematic structural diagrams of steps in a salicide barrier layer etching method.
Figure 2:
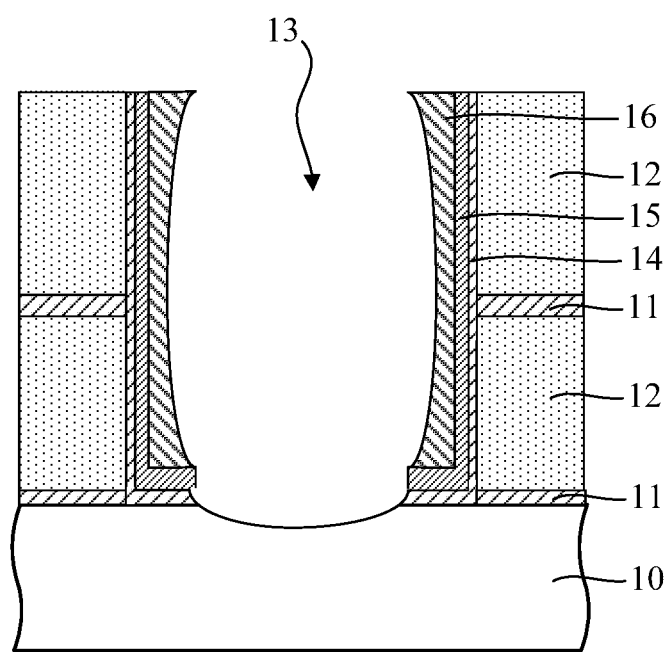
Figure 3:
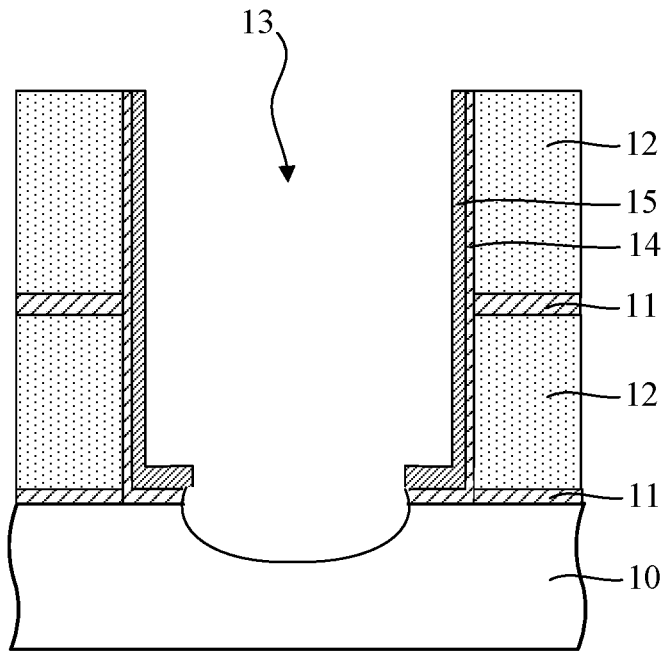

FIG. 1 to FIG. 3 are schematic structural diagrams of steps in a salicide barrier layer etching method. Referring to FIG. 1 to FIG. 3, the salicide barrier layer etching method is specifically as below.

First, referring to FIG. 1, a substrate 10 is provided. Then a laminated structure of a silicon oxide layer 11 and a polysilicon layer 12 is sequentially formed on the substrate 10. Then a patterned photoresist layer (not shown) is formed on the polysilicon layer 12 at the top. The patterned photoresist layer is used as a mask, and the laminated structure is etched till the substrate 10 is exposed. A trench 13 exposing the substrate 10 is formed. Finally, the patterned photoresist layer is removed.

After the trench 13 is formed, the method further includes: forming an oxide layer 14 and a metal barrier layer 15 on a side wall and a bottom of the trench 13. The material of the oxide layer 14 includes but is not limited to silicon oxide. The material of the metal barrier layer 15 includes but is not limited to silicon nitride. Subsequently, the metal barrier layer 15 is etched, to expose the oxide layer 14 located at the center of the bottom of the trench 13.

Subsequently, still referring to FIG. 1, a salicide barrier layer 16 is formed on the substrate 10. The salicide barrier layer 16 covers an upper surface of the polysilicon layer 12 and the side wall and the bottom of the trench 13. FIG. 1 shows only one part of the substrate 10 formed with the trench 13, and the substrate 10 further includes the other part not formed with the trench 13. In this embodiment, after the salicide barrier layer 16 is formed, the salicide barrier layer 16 on the trench 13 needs to be removed. The remaining part of the salicide barrier layer 16 on the substrate 10 is left, to perform a subsequent manufacturing process. Therefore, FIG. 1 shows only the part needing to be removed. In this embodiment, a material of the salicide barrier layer 16 is preferably silicon oxide.

Subsequently, the salicide barrier layer 16 is partially etched by dry etching, to remove a part of the salicide barrier layer 16 in the trench 13. Next, referring to FIG. 2, the remaining salicide barrier layer 16 is etched by wet etching. For example, the salicide barrier layer 16 is etched by using an HF. However, due to isotropy of wet etching, the HF has a transverse etching action on silicon oxide, and a circular arc-shaped structure is formed on the side wall of the trench 13. In addition, to completely remove the salicide barrier layer 16 on the side wall of the trench 13, over-etching needs to be performed. In this way, although the salicide barrier layer 16 on the side wall of the trench 13 is completely removed, over-etching may cause the substrate 10 on the bottom of the trench 13 to be etched, to form an arc-shaped recess, as shown in FIG. 3. Such a topography is disadvantageous for deposition of subsequent conductive substances, and a defect structure such as a void is easily formed, causing a leakage of electricity or a breakdown to easily occur in a finally formed device, and affecting performance.

In view of the foregoing problem, the inventor provides a method for alleviating an etching defect of a salicide barrier layer, including: providing a substrate, and forming a trench in the substrate; forming a salicide barrier layer. The salicide barrier layer covers a side wall and a bottom of the trench and an upper surface of the substrate. The salicide barrier layer includes a first barrier layer, a second barrier layer and a third barrier layer sequentially located on the substrate. The method further includes performing a first etching process to remove the third barrier layer in the trench to expose the second barrier layer; performing a second etching process to remove the second barrier layer in the trench to expose the first barrier layer; and performing a third etching process to remove the first barrier layer in the trench to expose the trench, and forming a patterned salicide barrier layer exposing the trench.

The salicide barrier layer includes the first barrier layer, the second barrier layer and the third barrier layer. When the salicide barrier layer is being etched, the third barrier layer is removed during the first etching process. In this case, the second barrier layer is used as an etch stop layer. The second barrier layer is removed during the second etching process. In this case, the first barrier layer is used as an etch stop layer. And the first barrier layer is removed during the third etching process. The salicide barrier layer is divided into three layers, and the second barrier layer and the first barrier layer are respectively used as an etch stop layer during the first etching process and an etch stop layer during the second etching process, so that the third barrier layer and the second barrier layer can be prevented from being over-etched, thereby effectively avoiding defects caused by over-etching and alleviating device performance.

To make content of the present invention clearer and more comprehensible, the following further describes the content of the present invention with reference to the accompanying drawings. Certainly, the present invention is not limited to the specific embodiment, and common replacements known by a person skilled in the art also fall within the protection scope of the present invention.

Apparently, the described embodiments are merely some rather than all of the embodiments of the present invention. All other embodiments obtained by a person of ordinary skill in the art based on the embodiments of the present invention without creative efforts shall fall within the protection scope of the present invention. Second, the present invention is described in detail by using schematic diagrams. When the embodiments of the present invention are described in detail, for ease of description, the schematic diagrams are not partially enlarged in accordance with the general scale, and should not be considered as a limitation to the present invention.

Figure 4:
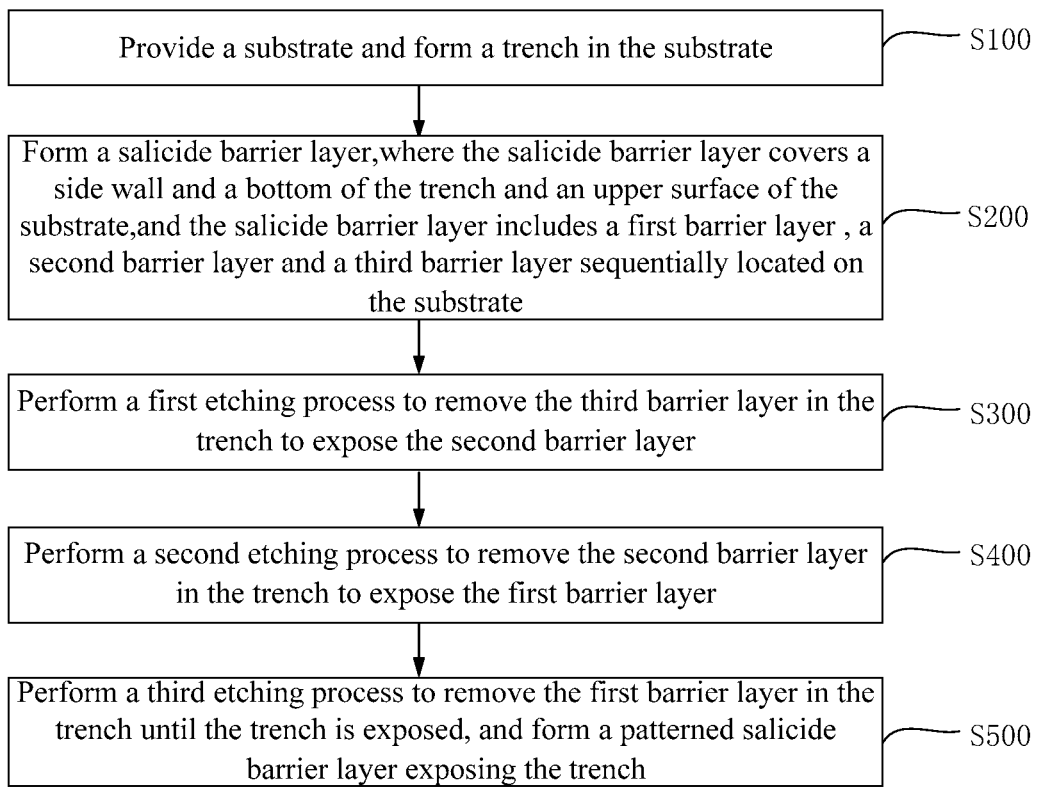
FIG. 4 is a flowchart of a method for alleviating an etching defect of a salicide barrier layer according to an embodiment of the present invention.

FIG. 4 is a flowchart of a method for alleviating an etching defect of a salicide barrier layer according to an embodiment of the present invention. FIG. 5 to FIG. 8 are schematic structural diagrams of steps in a method for alleviating an etching defect of a salicide barrier layer according to an embodiment of the present invention. The following describes in detail the steps in the method for alleviating an etching defect of a salicide barrier layer in this embodiment with reference to FIG. 5 to FIG. 8.

Figure 5:
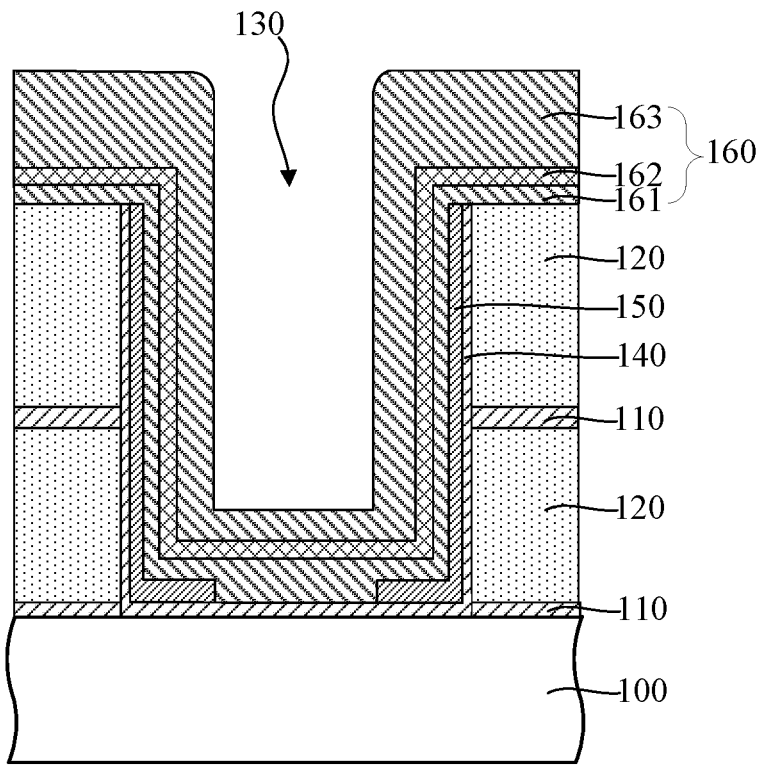
FIG. 5 to FIG. 8 are schematic structural diagrams of steps in a method for alleviating an etching defect of a salicide barrier layer according to an embodiment of the present invention.

In step S100, referring to FIG. 5, a substrate 100 is provided, and a trench 130 is formed in the substrate 100.

A material of the substrate 100 may be monocrystalline silicon (Si), monocrystalline germanium (Ge), silicon germanium (GeSi) or silicon carbide (SiC), or may be silicon on insulator (SOI), or germanium on insulator (GOI); or may be other materials, for example, III-V group compound such as gallium arsenide. In this embodiment, the material of the substrate 100 is preferably monocrystalline silicon (Si).

The substrate 100 includes a first area and a second area. The first area needs to subsequently form metal salicide, and does not need to be protected by the salicide barrier layer. The second area does not need to subsequently form metal salicide, and needs to be protected by the salicide barrier layer. In a subsequent step, the salicide barrier layer needs to be formed on the substrate 100, and the salicide barrier layer within the first area needs to be removed. The figure of this embodiment shows only a part of the first area.

First, referring to FIG. 5, a laminated structure of a dielectric layer 110 and a polysilicon layer 120 is sequentially formed on the substrate 100. Subsequently, a patterned photoresist layer (not shown) is formed on the polysilicon layer 120 at the top. The patterned photoresist layer is used as a mask, and the laminated structure is etched, to expose the substrate 100, to form the trench 130 exposing the substrate 100. And finally, the patterned photoresist layer is removed.

In this embodiment, a material of the dielectric layer 110 includes but is not limited to silicon oxide, and a thermal oxidation method may be used to form the dielectric layer 110 on the substrate 100 or the polysilicon layer 120. A thickness of the dielectric layer 110 is far smaller than that of the polysilicon layer 120.

Subsequently, an oxide layer 140 and a metal barrier layer 150 are sequentially formed on a side wall and a bottom of the trench 130. A material of the oxide layer 140 includes but is not limited to silicon oxide, and the oxide layer 140 may be formed by using a thermal oxidation method. A material of the metal barrier layer 150 includes but is not limited to silicon nitride, and the metal barrier layer 150 may be formed by using a chemical vapor deposition method. After the metal barrier layer 150 is formed, the method further includes: etching the metal barrier layer 150, to expose the oxide layer 140 at the center of the bottom of the trench 130, as shown in FIG. 5. Certainly, in another embodiment, the metal barrier layer 150 may be alternatively directly formed on the side wall of the trench 130 and close to a bottom of the side wall. That is, metal barrier layers 150 located on two sides of the trench are not in contact with each other.

In step S200, still referring to FIG. 5, a salicide barrier layer 160 is formed, where the salicide barrier layer 160 covers a side wall and a bottom of the trench 130 and an upper surface of the substrate 100. The salicide barrier layer 160 includes a first barrier layer 161, a second barrier layer 162 and a third barrier layer 163 sequentially located on the substrate 100.

Preferably, materials of the first barrier layer 161 and the third barrier layer 163 are the same. In this embodiment, the materials of the first barrier layer 161 and the third barrier layer 163 include but are not limited to oxide. Preferably, the materials of the first barrier layer 161 and the third barrier layer 163 are silicon oxide. A material of the second barrier layer 162 includes but is not limited to nitride. Preferably, the material of the second barrier layer 162 is silicon nitride. That is, the salicide barrier layer is a silicon oxide-silicon nitride-silicon oxide laminated structure.

A thickness of the first barrier layer 161 is smaller than a thickness of the second barrier layer 162. The thickness of the second barrier layer 162 is smaller than a thickness of the third barrier layer 163. In this embodiment, the thickness of the first barrier layer ranges from 70 Å to 100 Å. For example, the thickness of the first barrier layer 161 is 70 Å, 80 Å, 85 Å, 90 Å or 100 Å, and preferably 85 Å. The thickness of the second barrier layer 162 ranges from 200 Å to 300 Å. For example, the thickness of the second barrier layer 162 is 200 Å, 220 Å, 240 Å, 250 Å, 260 Å, 280 Å or 300 Å, and preferably 250 Å. The thickness of the third barrier layer 163 ranges from 300 Å to 500 Å. For example, the thickness of the third barrier layer 163 is 300 Å, 350 Å, 400 Å, 450 Å or 500 Å, and preferably 400 Å.

Figure 6:
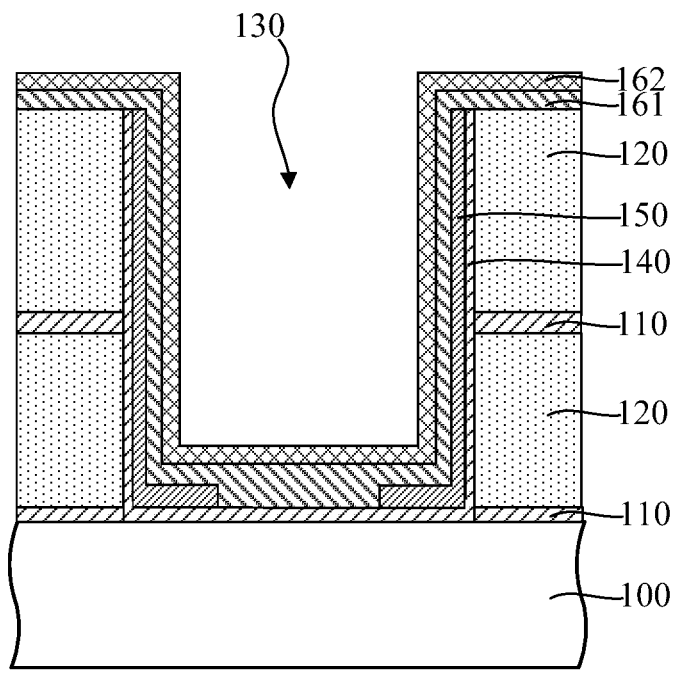

In step S300, referring to FIG. 6, a first etching process is performed to remove the third barrier layer 163 in the trench 130 to expose the second barrier layer 162.

The second barrier layer 162 is used as an etch stop layer, and the third barrier layer 163 is removed by etching. A wet etching method may be used to remove the third barrier layer 163. In this embodiment, an HF is used as an etchant. That is, the second barrier layer 162 is used as an etch stop layer, and the third barrier layer 163 is removed by using the HF. Because the second barrier layer 162 is arranged, the substrate 100 is not over-etched when the third barrier layer 163 is being etched. In the HF, a ratio of acid to water ranges from 1:50 to 1:150. Preferably, in the HF, the ratio of acid to water is 1:100.

Figure 7:
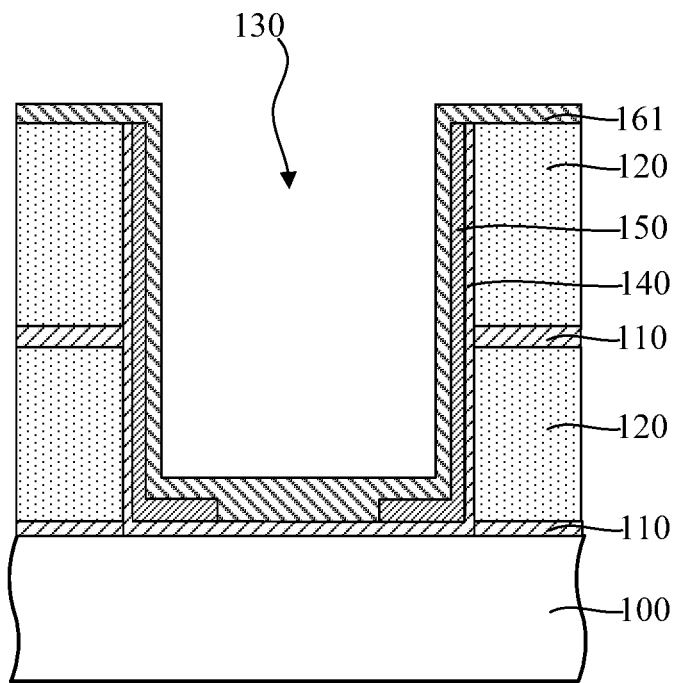

In step S400, referring to FIG. 7, a second etching process is performed to remove the second barrier layer 162 in the trench 130 to expose the first barrier layer 161.

The first barrier layer 161 is used as an etch stop layer, and the second barrier layer 162 is removed by etching. The wet etching method may be used to remove the second barrier layer 162. In this embodiment, a phosphate is used as an etchant. That is, the first barrier layer 161 is used as an etch stop layer, and the second barrier layer 162 is removed by using the phosphate. Because the first barrier layer 161, the substrate 100 is not over-etched when the second barrier layer 162 is being etched. Concentration of the phosphate ranges from 75% to 85%. Preferably, the concentration of the phosphate is 80%.

Figure 8:
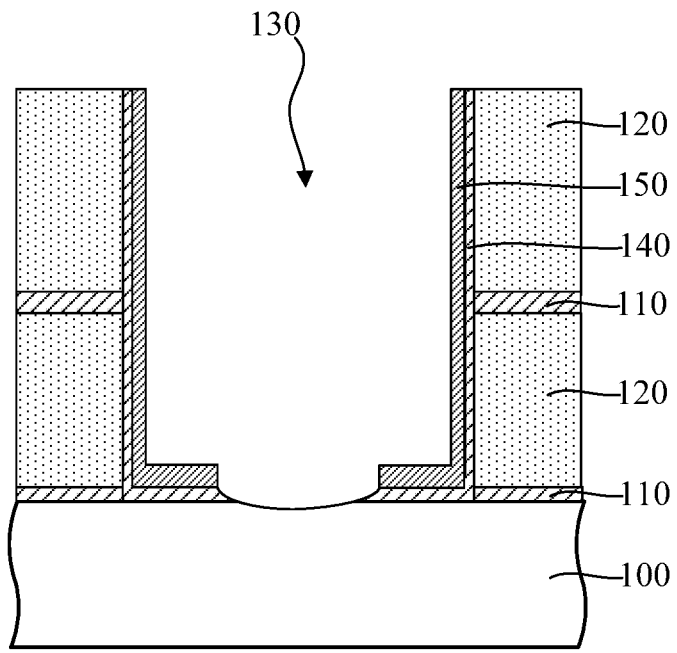

In step S500, referring to FIG. 8, a third etching process is performed to remove the first barrier layer 161 in the trench 130, exposing the trench 130, and a patterned salicide barrier layer exposing the trench is formed.

Because the materials of the first barrier layer 161 and the third barrier layer 163 are the same, the first barrier layer 161 and the third barrier layer 163 may be removed by using a same method. Certainly, in another embodiment, the first barrier layer 161 and the third barrier layer 163 may be alternatively removed by using different methods. In this embodiment, the first barrier layer 161 is removed by using the wet etching method. An HF is preferably used as an etchant. In the HF, a ratio of acid to water ranges from 1:50 to 1:150. Preferably, in the HF, the ratio of acid to water is 1:100.

In this embodiment, preferably, the thickness of the first barrier layer 161 is smaller than that of the third barrier layer 163. The thickness of the first barrier layer 161 is also smaller than that of the second barrier layer 162. The thickness of the first barrier layer ranges from 70 Å to 100 Å. Therefore, the first barrier layer 161 is easily removed, so that etching defects can be further avoided and device performance can be improved.

The salicide barrier layer 160 is divided into three layers. When the third barrier layer 163 is being etched, the second barrier layer 162 is used as an etch stop layer. When the second barrier layer 162 is being etched, the first barrier layer 161 is used as an etch stop layer. Compared with the prior art in which there is a salicide barrier layer of only one material, the second barrier layer 162 and the first barrier layer 161 both serve an etch stop layer, so that the third barrier layer 163 and the second barrier layer 162 can be prevented from being over-etched, thereby avoiding defects caused by over-etching and finally alleviating device performance. In FIG. 8, after the first barrier layer 161 is etched, although a circular arc-shaped structure is also formed, compared with that in FIG. 3, an arc curvature of the circular arc-shaped structure is significantly reduced. In addition, in a preferable condition, the thickness of the first barrier layer 161 is smaller than the thickness of the second barrier layer 162 and that of the third barrier layer 163. Therefore, the first barrier layer 161 is easily removed, so that etching defects can be further avoided and device performance can be improved.

In the method for alleviating an etching defect of a salicide barrier layer provided in the present invention, the salicide barrier layer 160 includes the first barrier layer 161, the second barrier layer 162 and the third barrier layer 163. When the salicide barrier layer 160 is being etched, the third barrier layer 163 is removed during the first etching process. In this case, the second barrier layer 162 is used as an etch stop layer. The second barrier layer 162 is removed during the second etching process. In this case, the first barrier layer 161 is used as an etch stop layer, and the first barrier layer 161 is removed during the third etching process. Compared with the prior art, the salicide barrier layer 160 is divided into three layers, and the second barrier layer 162 and the first barrier layer 161 are respectively used as an etch stop layer during the first etching process and an etch stop layer and the second etching process, so that the third barrier layer 163 and the second barrier layer 162 can be prevented from being over-etched, thereby effectively avoiding defects caused by over-etching and alleviating device performance.

In conclusion, in the method for alleviating an etching defect of a salicide barrier layer provided in the present invention, the salicide barrier layer includes a first barrier layer, a second barrier layer and a third barrier layer. When the salicide barrier layer is being etched, the third barrier layer is removed during the first etching process. In this case, the second barrier layer is used as an etch stop layer, and the second barrier layer is removed during the second etching process. In this case, the first barrier layer is used as an etch stop layer, and the first barrier layer is removed during the third etching process. The salicide barrier layer is divided into three layers, and the second barrier layer and the first barrier layer are respectively used as an etch stop layer during the first etching process and an etch stop layer during the second etching process, so that the third barrier layer and the second barrier layer can be prevented from being over-etched, thereby effectively avoiding defects caused by over-etching and alleviating device performance.

Further, a thickness of the first barrier layer is smaller than a thickness of the third barrier layer. The thickness of the first barrier layer is smaller than a thickness of the second barrier layer. Therefore, the first barrier layer is easily removed, so that etching defects can be further avoided and device performance can be improved.

The foregoing descriptions are merely descriptions of preferred embodiments of the present invention, and are not intended to limit the scope of the present invention. Any changes and modifications made by a person of ordinary skill in the art based on the foregoing disclosed content shall fall within the protection scope of the claims.

What is claimed is:

1. A method for alleviating an etching defect of a salicide barrier layer, comprising:
    providing a substrate and forming a trench in the substrate;
    forming a salicide barrier layer, the salicide barrier layer covering a side wall and a bottom of the trench and an upper surface of the substrate, the salicide barrier layer comprising a first barrier layer, a second barrier layer and a third barrier layer sequentially formed on the substrate;
    performing a first etching process to remove the third barrier layer in the trench until the second barrier layer is exposed;
    performing a second etching process to remove the second barrier layer in the trench until the first barrier layer is exposed; and
    performing a third etching process to remove the first barrier layer in the trench until the trench is exposed, thereby a patterned salicide barrier layer that exposes the trench is formed.

2. The method for alleviating an etching defect of a salicide barrier layer according to claim 1, wherein the first barrier layer and the third barrier layer are formed of a same material.

3. The method for alleviating an etching defect of a salicide barrier layer according to claim 2, wherein the first barrier layer and the third barrier layer are both oxide layers, and the second barrier layer is a nitride layer.

4. The method for alleviating an etching defect of a salicide barrier layer according to claim 3, wherein the first barrier layer and the third barrier layer are both silicon oxide layers, and the second barrier layer is a silicon nitride layer.

5. The method for alleviating an etching defect of a salicide barrier layer according to claim 4, wherein the first barrier layer has a thickness smaller than a thickness of the second barrier layer, and the second barrier layer has the thickness smaller than a thickness of the third barrier layer.

6. The method for alleviating an etching defect of a salicide barrier layer according to claim 5, wherein: the thickness of the first barrier layer ranges from 70 Å to 100 Å; the thickness of the second barrier layer ranges from 200 Å to 300 Å; and the thickness of the third barrier layer ranges from 300 Å to 500 Å.

7. The method for alleviating an etching defect of a salicide barrier layer according to claim 1, wherein the first etching process, the second etching process and the third etching process are all wet etching.

8. The method for alleviating an etching defect of a salicide barrier layer according to claim 7, wherein etchants used in the first etching process and the third etching process are hydrofluoric acids and an etchant used in the second etching process is a phosphate.

9. The method for alleviating an etching defect of a salicide barrier layer according to claim 1, wherein forming a trench in the substrate comprises:
    sequentially forming a laminated structure of a dielectric layer and a polysilicon layer on the substrate;
    forming a patterned photoresist layer on the polysilicon layer at the top;

using the patterned photoresist layer as a mask, etching the laminated structure to form the trench; and removing the patterned photoresist layer.

10. The method for alleviating an etching defect of a salicide barrier layer according to claim 9, wherein after forming a trench and before forming a salicide barrier layer, the method further comprises:

forming an oxide layer on the side wall and the bottom of the trench; and forming a metal barrier layer on the side wall and the bottom of the trench.

11. The method for alleviating an etching defect of a salicide barrier layer according to claim 10, wherein after forming a metal barrier layer and before forming a salicide barrier layer, the method further comprises: etching the metal barrier layer to expose the oxide layer located at a center of the bottom of the trench.

* * * * *